(12) United States Patent  
Brand et al.

(10) Patent No.: US 6,794,873 B2
(45) Date of Patent: Sep. 21, 2004

(54) GRADIENT COIL SYSTEM FOR A MAGNETIC RESONANCE APPARATUS

(75) Inventors: Martin Brand, Erlangen (DE); Oliver Heid, Gunzenhausen (DE)

(73) Assignee: Siemens Aktiengesellschaft, Münich (DE)

( * ) Notice: Subject to any disclaimer, the term of this patent is extended or adjusted under 35 U.S.C. 154(b) by 104 days.

(21) Appl. No.: 10/025,057

(22) Filed: Dec. 18, 2001

(65) Prior Publication Data

US 2002/0105403 A1 Aug. 8, 2002

(30) Foreign Application Priority Data

Dec. 18, 2000 (DE) .......................................... 100 63 087

(51) Int. Cl.$^7$ ................................................ G01V 3/00
(52) U.S. Cl. ........................................ 324/319; 324/318
(58) Field of Search ................................. 324/319, 318, 324/309, 307, 311, 322; 28/653.5; 336/224; 335/299

(56) References Cited

U.S. PATENT DOCUMENTS

| | | | | |
|---|---|---|---|---|
| 5,198,769 A | * | 3/1993 | Frese et al. ................. | 324/318 |
| 5,512,828 A | * | 4/1996 | Pausch et al. ............... | 324/309 |
| 5,561,371 A | * | 10/1996 | Schenck ...................... | 324/318 |
| 5,563,567 A | * | 10/1996 | Westphal ..................... | 335/299 |
| 5,675,255 A | * | 10/1997 | Sellers et al. ............... | 324/318 |
| 5,736,858 A | * | 4/1998 | Katznelson ................. | 324/318 |
| 6,504,370 B2 | * | 1/2003 | Heid ........................... | 324/318 |

FOREIGN PATENT DOCUMENTS

| | | |
|---|---|---|
| DE | OS 42 25 592 | 2/1994 |
| GB | 2 265 986 | 10/1993 |

* cited by examiner

Primary Examiner—Brij B. Shrivastav
(74) Attorney, Agent, or Firm—Schiff Hardin LLP

(57) ABSTRACT

A gradient coil system for a magnetic resonance apparatus has an area for receiving an examination subject and at least one gradient coil with an conductor arrangement for generating a magnetic gradient field having a main field component collinear to a basic magnetic field and at least one accompanying component that is perpendicular to the main field component, and at least one further conductor arrangement for feeding electrical current and which is fashioned and arranged for generating a non-homogeneous magnetic field such that the main field component, at least in the area, is approximately unaltered and such that the accompanying field component is reduced.

5 Claims, 5 Drawing Sheets

GRADIENT COIL SYSTEM FOR A MAGNETIC RESONANCE APPARATUS

BACKGROUND OF THE INVENTION

1. Field of the Invention

The present invention relates to a gradient coil system for a magnetic resonance apparatus with an area provided to receive an examination subject.

2. Description of the Prior Art

Magnetic resonance is a known technology for acquiring images of the inside of a body. In a magnetic resonance apparatus, rapidly switched gradient fields are superimposed on a static basic magnetic field that is generated by a basic field magnetic system. Furthermore, the magnetic resonance apparatus has a high-frequency system which irradiates high-frequency signals into the examination subject for triggering magnetic resonance signals and which detects the generated magnetic resonance signals on the basis of which magnetic resonance images are produced.

The gradient system includes a gradient coil system having gradient coils and controlled gradient amplifiers. One of the gradient coils generates a gradient field for a specific spatial direction. This gradient field, in the ideal case, has only a main field component, which is collinear to the basic magnetic field, at least within an imaging volume. The main field component has a prescribable main gradient which, at any arbitrary point in time, by approximation, has the same magnitude at all locations manner at least within the imaging volume. Since the gradient field is a chronologically variable magnetic field, the aforementioned is true for any point in time, however, the intensity of the main gradient is variable from one point in time to another point in time. The design of the gradient coil normally prescribes the direction of the main gradient.

Due to Maxwell's fundamental equations, gradient coils, contrary to the desired ideal case, cannot be fashioned which generate only the aforementioned main component over the imaging volume. At least one accompanying field component, which is perpendicularly directed to the main field component, is unavoidably associated with the main field component.

Appropriate currents must be adjusted in the gradient coil in order to generate the gradient field. The amplitudes of the required currents are several 100 A. The current increase and decrease rates ("slew rate") are several 100 kA/s. For the current supply, the gradient coil is connected to a controlled gradient amplifier.

As a result of the switching of the gradient fields, stimulations can be triggered in a living examination subject during the pickup of magnetic resonance images. The gradient fields acting on the examination subject are characterized by a chronologically varying, magnetic flux density generating eddy currents and induction currents in the examination subject. The intensity of the aforementioned electrical currents, among other things, depends on the cross-sectional area in which the gradient field acts and on the chronological behavior of the gradient field. The aforementioned currents traverse regions of the examination subject with different electrical conductivity and thereby effect corresponding electrical voltages. If the voltage exceeds a specific threshold, stimulations of the examination subject are triggered. For example, it is known from German OS 42 25 592 that the highest current values or voltage values, given switched gradient fields, are induced at the edge or outside of the imaging volume where the field boost of the magnetic flux density of the gradient field is at a maximum, so that the danger of stimulations is the highest there.

For preventing such stimulations, it is known from German OS 42 25 592 to cover stimulation-sensitive regions, outside of the imaging volume, with a closed conductor loop. As a result, the currents induced in the covered region are reduced. The aforementioned cover, however, is only possible outside of the imaging volume, but not in edge regions of the imaging volume, since the linearity of the gradient fields in the imaging volume and the homogeneity of the basic magnetic field are otherwise impaired, the linearity of the gradient fields in the imaging volume being crucial for the image quality. Another disadvantage is that the position of the conductor loops normally must also be adapted when a region of the examination subject to be imaged is modified.

German PS 195 27 020, in a hollow cylindrically shaped gradient coil system for a transversal gradient coil, describes a combination of a segment gradient coil and a gradient coil that is composed of saddle shaped sub-coils. The combination is to maintain the advantages of both types of gradient coils and their disadvantages are to be reduced at the same time. An intense accompanying field component, which is more intense than the usable main field component, is a disadvantage of the gradient coil that is composed of saddle shaped sub-coils. Among other things, the combination is intended to significantly reduce the accompanying field component and therefore the danger of stimulations as a result of rapidly switched gradients.

SUMMARY OF THE INVENTION

An object of the invention is to provide an improved gradient coil system with which, among other things, high intensities of a rapidly switched gradient field can be obtained without stimulating a living examination subject.

The object is inventively achieved by a gradient coil system for a magnetic resonance apparatus having an area provided for an examination subject, wherein at least one gradient coil with a conductor arrangement is provided for generating a magnetic gradient field having a main field component that is collinear to a basic magnetic field and at least one accompanying field component that is perpendicular to the main field component, and wherein at least one further conductor arrangement which is provided for feeding electrical current and is fashioned and arranged for generating a non-homogeneous magnetic field such that the main field component is approximately unaltered at least in the area such that the accompanying field component is reduced.

Therefore, the undesired accompanying component can be compensated at least in the area in which the living subject to be examined by magnetic resonance technology is situated. Therefore, the gradient field permeating the examination subject can be reduced to the magnetic resonance image-effective main field component, so that a stimulation probability of the examination subject can be reduced or an intensity of the gradient field that can be used without danger can be increased. In contrast to conventional shielding coils that attenuate the main field component and accompanying field component in the area approximately to the same extent, the further conductor arrangement is designed such that the accompanying field component is simultaneously attenuated to a much greater extent given an attenuation of the main field component, so that the previously described effect stimulations are less likely.

DESCRIPTION OF THE PREFERRED EMBODIMENTS

Figure 1:
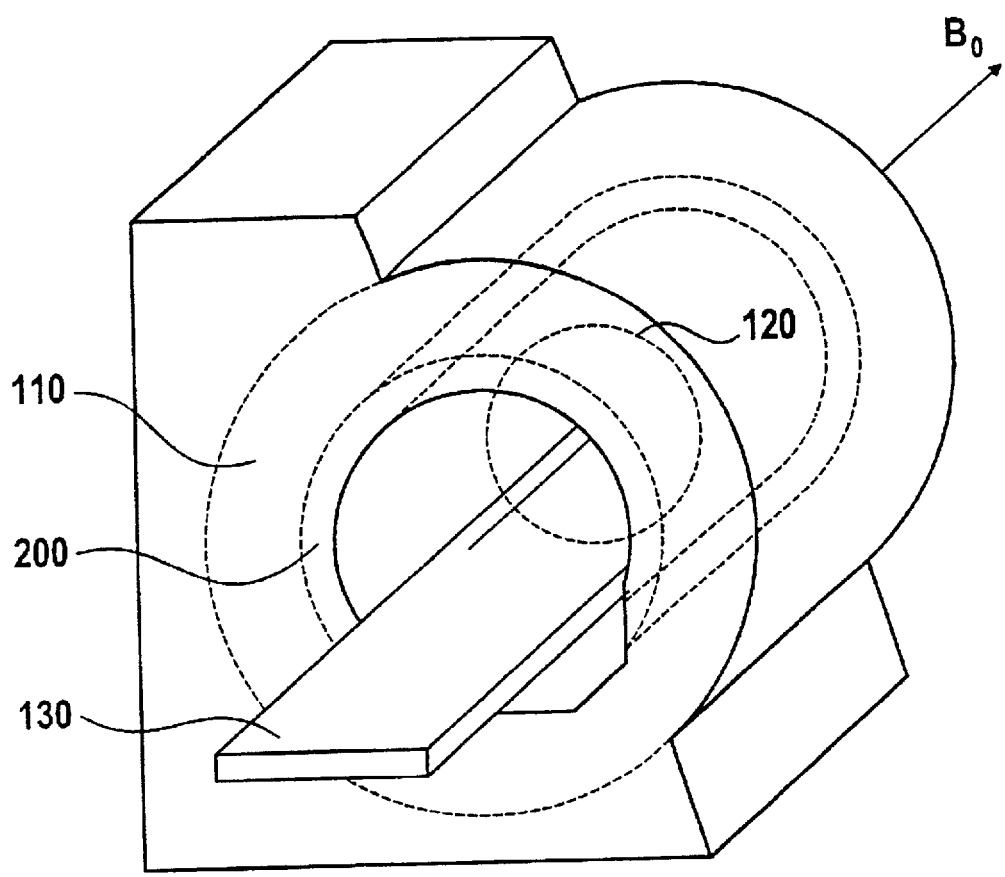
FIG. 1 is a perspective view of shows a magnetic resonance device.

FIG. 1 shows a magnetic resonance apparatus in a perspective view. The magnetic resonance apparatus has a basic field magnetic system 110 for generating an optimally homogenous static basic magnetic field $B_0$ at least within an imaging volume 120. Furthermore, the magnetic resonance apparatus has a gradient coil system 200 for generating gradient fields. A movable support device 130 of the apparatus, among other things, serves the purpose of positioning a region of an examination subject, which is borne on the support device 130 and which is to be imaged, in the imaging volume 120. In order to simplify, further components of the apparatus, such as an antenna system, are not shown.

The gradient coil system 200 is essentially hollow cylindrically fashioned and, among other things, has a longitudinal gradient coil for generating a magnetic gradient field with a main gradient in the direction of the basic magnetic field $B_0$, two transversal gradient coils for generating magnetic gradient fields with main gradients perpendicular to the basic magnetic field $B_0$, cooling devices, shim devices and shielding coils appertaining to the respective gradient coils.

Figure 2:
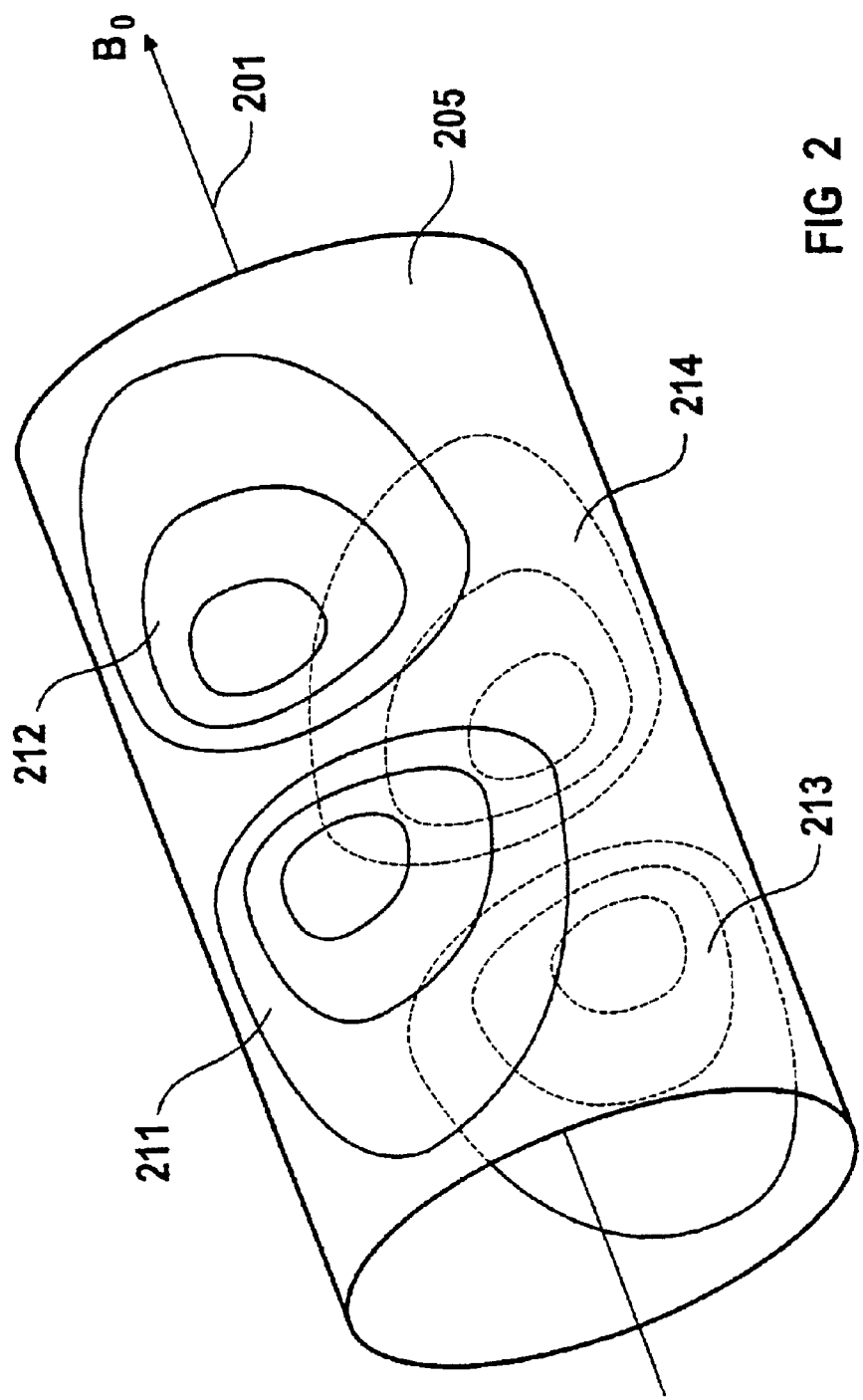
FIG. 2 shows a layer of a hollow cylindrically shaped gradient coil system of the magnetic resonance apparatus.

FIG. 2 shows a hollow cylindrically shapely-shaped layer 205 of the gradient coil system 200 within which one of the transversal gradient coils is arranged. The transversal gradient coil has four sub-coils 211 to 214 that are fashioned in a saddle shaped manner, for example as coils referred to as fingerprint coils in one embodiment. The conductor paths of the respective sub-coils 211, 212, 213 and 214 are schematically outlined with a few turns. The hollow cylindrically shaped gradient coil system 200 has a hollow cylinder principal axis 201 which is parallel to a directional vector of the basic magnetic field $B_0$.

Figure 3:
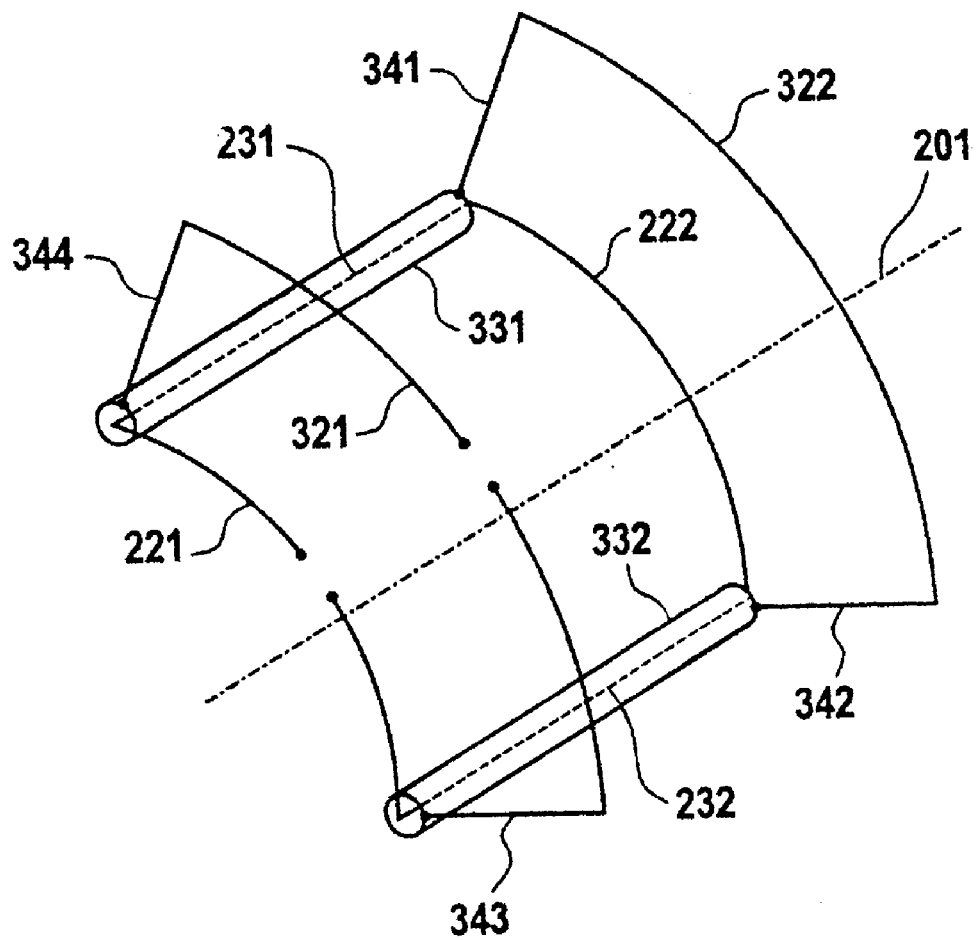
FIG. 3 shows sub-coils of a gradient coil, which are fashioned in a saddle shaped manner, and of an appertaining shielding coil whose longitudinal conductor sections are arranged corresponding to a coaxial conductor.

As an exemplary embodiment of the invention, FIG. 3 shows sub-coils of a gradient coil, which are fashioned in a saddle shaped manner, and of an appertaining shielding coil whose longitudinal conductor sections are arranged corresponding to a coaxial conductor. For explanatory purposes, the saddle shaped sub-coil 201 of the transversal gradient coil of FIG. 2 is used as an example. In FIG. 3, the sub-coil is outlined and is shown with only one turn. The turn has two arc-like conductor sections 221 and 222 extending in circumferential direction of the hollow cylinder and two straight longitudinal conductor sections 231 and 232 extending parallel to the hollow cylinder principal axis 201. In order to feed an appropriate electrical current into the turn, the arc-like conductor section 221 has an interruption forming two connecting points via which the sub-coil 211 is fed with current. Electrical current flowing in the arc-like conductor sections 221 and 222 essentially produces a desired main field component of the magnetic gradient field that can be generated by the gradient coil.

The current flowing in the longitudinal conductor sections 231 and 232 essentially produces at least one undesired accompanying field component of the gradient field.

Arc-like conductor sections 321 and 322 of a sub-coil of a shielding coil that also belongs to the gradient coil are arranged in a hollow cylindrically shaped layer which, relative to the layer 205 of the sub-coil 221, is located further outside in the gradient coil system 200. The sub-coil is also fashioned in a saddle shaped manner. Similar to the arc-like conductor section 221 of the gradient coil, the arc-like conductor section 321 of the shielding coil is also interrupted for feeding current. The shielding coil is switched with the gradient coil such that current flowing in the sub-coil 221, in an opposite direction, simultaneously flows in the sub-coil of the shielding coil. In addition to the arc-like conductor sections 321 and 322, the sub-coil of the shielding coil, which is schematically only shown with one turn, also has radially fashioned conductor sections 341 to 344 and tubular longitudinal conductor sections 331 and 332. The tubular conductor section 331 and 332 of the shielding coil and the longitudinal conductor section 231 or, respectively 232 of the gradient coil, electrically insulated from one another, are arranged such that they form a coaxial conductor. The tubular conductor sections 331 and 332 of the shielding coil, with respect to the corresponding longitudinal conductor sections 231 and 232 of the gradient coil, are simultaneously traversed by currents of equal strength but opposite direction when the gradient coil system 200 is operated. As a result of the coaxial conductor arrangement, a non-homogeneous magnetic field effecting the current flow in the tubular conductor sections 331 and 332 compensates the undesired accompanying field component which is essentially caused by the current flow in the longitudinal conductor sections 231 and 232 of the gradient coil. Therefore, the desired main field component of the magnetic gradient field remains unaltered.

Figure 4:
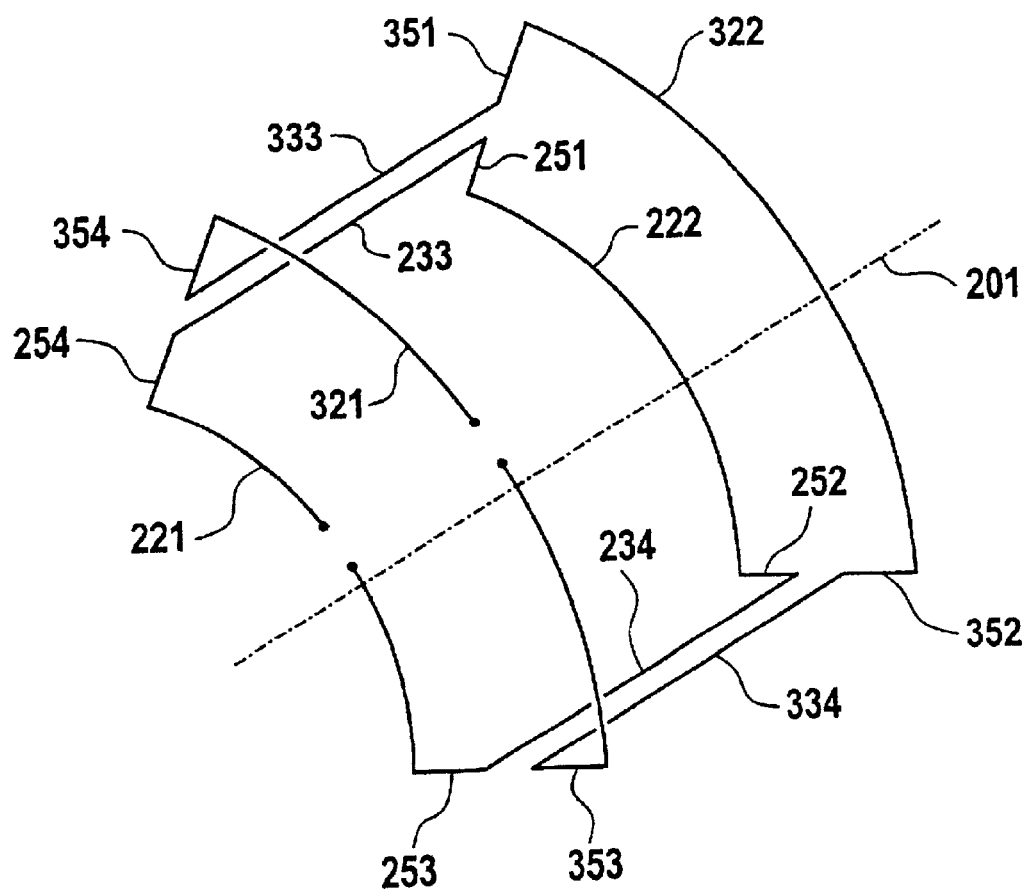
FIG. 4 shows sub-coils of a gradient coil, which are fashioned in a saddle shaped manner, and of a corresponding shielding coil whose longitudinal conductor sections are arranged in a tightly adjacent manner.

As a further exemplary embodiment of the invention, FIG. 4 shows saddle shaped sub-coils of a gradient coil and of a corresponding shielding coil whose longitudinal conductor sections are arranged in a tightly adjacent fashion. The conductor arrangement of FIG. 4 essentially differs from the arrangement of FIG. 3 by a different configuration and fashioning of the longitudinal conductor sections—not only of the gradient coil but also of the corresponding shielding coil. The operating method and function concerning the compensation of the accompanying field component also correspond. In addition to the arc-like conductor sections 221 and 222, the saddle shaped sub-coil of the gradient coil has radially fashioned conductor sections 241 to 244 and longitudinal conductor sections 233 and 234. The longitudinal conductor sections 233 and 234 are situated in a hollow cylindrically shaped layer of the gradient coil system 200 which, with respect to a hollow cylindrically shaped layer of the arc-like conductor sections 221 and 222, is arranged at a distance and further outside within the gradient coil system 200. In addition to the arc-like conductor sections 321 and 322, the sub-coil of the shielding coil has radially fashioned conductor sections 351 to 354 and longitudinal conductor sections 333 and 334. The longitudinal conductor sections 333 and 334 of the shielding coil, electrically insulated from the longitudinal conductor sections 233 and 234, are arranged in a hollow cylindrically shaped layer enclosing the layer of the longitudinal conductor sections 233 and 234 of the gradient coil in an immediately adjacent fashion. The arc-like conductor sections 321 and 322 of the shielding coil, with respect to the layer of the longitudinal conductor sections 333 and 334, are situated in a hollow cylindrically shaped layer which is arranged further outside in the gradient coil system 200.

Figure 5:
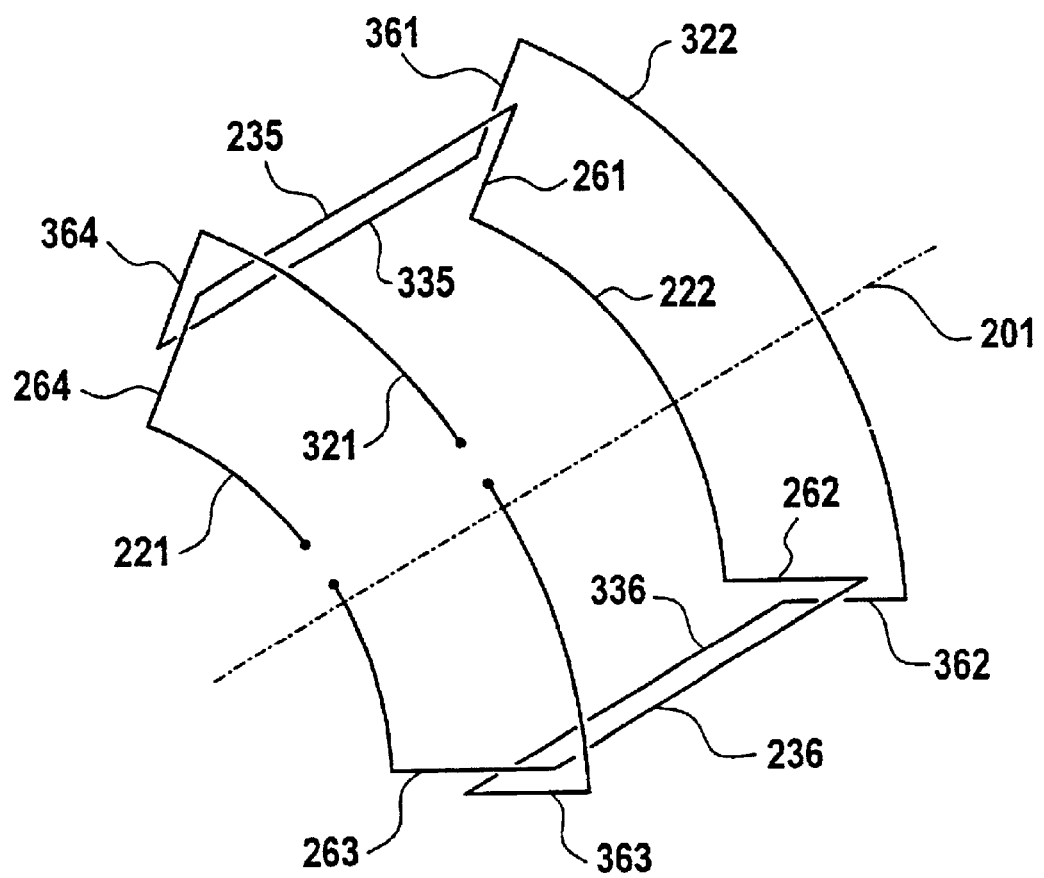
FIG. 5 shows sub-coils of a gradient coil, which are fashioned in a saddle shaped manner, and of a corresponding shielding coil whose longitudinal conductor sections are arranged in an interlaced manner.

As a further exemplary embodiment of the invention, FIG. 5 shows saddle shaped sub-coils of a gradient coil and of a corresponding shielding coil whose longitudinal conductor sections are arranged in an interlaced fashion. In contrast to the conductor arrangement of FIG. 4, longitudinal conductor sections 235 and 236, radially fashioned conductor sections 261 to 264 of the gradient coil, longitudinal conductor sections 335 and 336, and radially fashioned conductor sections 361 to 364 of the shielding coil are arranged and fashioned such that each of the longitudinal conductor section 235 and 236 of the gradient coil is interlaced with respect to the longitudinal conductor section 335 or 336, respectively. With this interlacing, the longitudinal conductor sections 235 and 236 of the gradient coil are arranged in a hollow cylindrically shaped layer of the gradient coil system 200 which is situated farther outside in the gradient coil system 200 than the hollow cylindrically shaped layer in which the longitudinal conductor sections 335 and 336 of the shielding coil are arranged. Therefore, the accompanying field component, particularly for an area in the inside of the hollow cylinder in which an examination subject can extend, is effectively compensated due to a number of turns of the gradient coil that is normally greater vis-à-vis the shielding coil.

Thus in each of the embodiments described above in FIGS. 3, 4 and 5, the gradient coil longitudinal conductor sections are spaced from the shielding coil longitudinal conductor sections at a distance that is less than the radial spacing between the gradient coil circumferential conductor sections and the shielding coil circumferential conductor sections.

Although modifications and changes may be suggested by those skilled in the art, it is the intention of the inventors to embody within the patent warranted hereon all changes and modifications as reasonably and properly come within the scope of their contribution to the art.

We claim as our invention:

1. A hollow-cylindrical gradient coil system comprising:

a gradient coil comprising gradient coil circumferential conductor sections disposed longitudinally spaced from each other at a first cylindrical surface, and gradient coil longitudinal conductor sections electrically connecting said gradient coil circumferential conductor sections;

a shielding coil for shielding said gradient coil, comprising shielding coil circumferential conductor sections disposed longitudinally spaced from each other at a second cylindrical surface that is disposed a radial distance outside of said first cylindrical surface, and shielding coil longitudinal conductor sections electrically connecting said shielding coil circumferential conductor sections; and said gradient coil longitudinal conductor sections being spaced from said shielding coil longitudinal conductor sections at a distance that is less than said radial spacing.

2. A gradient coil system as claimed in claim 1 wherein said shielding coil longitudinal conductor sections respectively co-axially enclose said gradient coil longitudinal conductor sections.

3. A gradient coil system as claimed in claim 1 having a principal cylinder axis, and wherein said gradient coil longitudinal conductor sections are disposed a lesser distance from said principal cylinder axis than said shielding coil longitudinal conductor sections.

4. A gradient coil system as claimed in claim 1 wherein said gradient coil and said shielding coil are adapted to carry substantially equal respective currents therein.

5. A gradient coil system as claimed in claim 1 wherein said gradient coil and said shielding coil are adapted to carry respective currents therein in opposite directions.

* * * * *